United States Patent
Hong

(10) Patent No.: US 9,972,669 B2
(45) Date of Patent: May 15, 2018

(54) DISPLAY DEVICE WITH HETEROGENEOUS PIXEL ARRAY FOR BORDERLESS DESIGN

(71) Applicant: Motorola Mobility LLC, Chicago, IL (US)

(72) Inventor: Seongchul Hong, Vernon Hills, IL (US)

(73) Assignee: Motorola Mobility LLC, Chicago, IL (US)

(*) Notice: Subject to any disclaimer, the term of this patent is extended or adjusted under 35 U.S.C. 154(b) by 41 days.

(21) Appl. No.: 15/227,635

(22) Filed: Aug. 3, 2016

(65) Prior Publication Data

US 2018/0040679 A1 Feb. 8, 2018

(51) Int. Cl.
| | | |
|---|---|---|
| H01L 29/08 | (2006.01) |
| H01L 21/00 | (2006.01) |
| G11C 11/00 | (2006.01) |
| H01L 27/32 | (2006.01) |
| H01L 51/52 | (2006.01) |
| G09G 3/36 | (2006.01) |
| G09G 3/3291 | (2016.01) |
| G09G 3/3233 | (2016.01) |
| H01L 27/12 | (2006.01) |

(52) U.S. Cl.
CPC ....... *H01L 27/3262* (2013.01); *G09G 3/3233* (2013.01); *G09G 3/3291* (2013.01); *G09G 3/3648* (2013.01); *H01L 27/3246* (2013.01); *H01L 27/3265* (2013.01); *H01L 51/5237* (2013.01); *H01L 27/1255* (2013.01); *H01L 2251/5338* (2013.01)

(58) Field of Classification Search
CPC ............ H01L 27/3246; H01L 27/3262; H01L 27/3265; H01L 27/5237; H01L 51/5237; G09G 3/3233; G09G 3/3291; G09G 3/3648
See application file for complete search history.

(56) References Cited

U.S. PATENT DOCUMENTS

| | | | |
|---|---|---|---|
| 8,004,178 B2 | 8/2011 | Lee | |
| 8,552,635 B2 | 10/2013 | Kim et al. | |
| 9,349,329 B2* | 5/2016 | Chen | G09G 3/36 |
| 9,361,059 B2* | 6/2016 | Swan | G06F 3/1446 |
| 9,373,814 B2 | 6/2016 | Liu et al. | |
| 9,414,463 B2* | 8/2016 | Ka | G06F 1/1601 |
| 2013/0032414 A1* | 2/2013 | Yilmaz | G06F 1/169 178/18.06 |
| 2016/0037609 A1* | 2/2016 | Ka | G06F 1/1601 313/511 |
| 2016/0231853 A1* | 8/2016 | Weng | G06F 3/0416 |
| 2016/0350052 A1* | 12/2016 | Chang | G06F 3/1446 |
| 2017/0092698 A1* | 3/2017 | Zou | H01L 27/326 |
| 2017/0131583 A1* | 5/2017 | Liu | G02B 5/045 |

* cited by examiner

*Primary Examiner* — Alonzo Chambliss
(74) *Attorney, Agent, or Firm* — Philip H. Burrus, IV

(57) ABSTRACT

An organic light emitting diode display includes a substrate defining a first pixel portion and one or more second pixel portions. Pixels formed in the first pixel portion can include a first driver circuit. Other pixels formed in the one or more second pixel portions can include a second driver circuit occupying less area along the substrate than the first driver circuit. At least one data driver circuit can then be collocated with the other pixels formed in at least one of the second pixel portions.

20 Claims, 11 Drawing Sheets

DISPLAY DEVICE WITH HETEROGENEOUS PIXEL ARRAY FOR BORDERLESS DESIGN

BACKGROUND

Technical Field

This disclosure relates generally to electronic device, and more particularly to displays for electronic devices.

Background Art

Mobile electronic communication devices, such as smartphones, are used by billions of people. These users employ mobile communication devices for many different purposes including, but not limited to, voice communications and data communications for text messaging, Internet browsing, commerce such as banking, and social networking. As the technology of these devices has advanced, so too has their feature set. For example, not too long ago all electronic devices had physical keypads. Today touch sensitive displays are more frequently seen as user interface devices.

One popular choice used for such displays is an organic light emitting diode (OLED) display. These displays are preferred because they are self-emissive and do not require a backlight as do older display designs. The absence of a need for a backlight allows OLED displays to consume less power. Additionally, OLED displays offer wider viewing angles and fast response times.

These faster and better displays are being used in many different electronic devices and in many different design applications. It would be advantageous to have an improved OLED display to further enhance these devices and applications.

Figure 1:
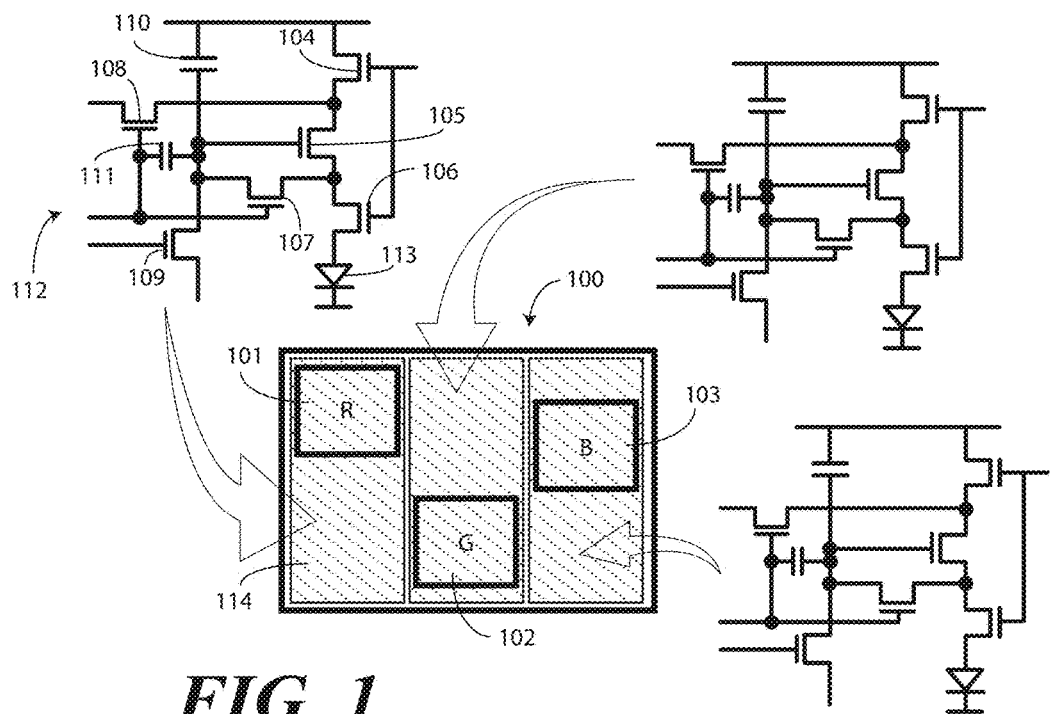
FIG. 1 illustrates one explanatory pixel for an OLED display in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions.

As used herein, components may be "operatively coupled" when information can be sent between such components, even though there may be one or more intermediate or intervening components between, or along the connection path. The terms "substantially" and "about" are used to refer to dimensions, orientations, or alignments inclusive of manufacturing tolerances. Thus, a "substantially orthogonal" angle with a manufacturing tolerance of plus or minus two degrees would include all angles between 88 and 92, inclusive. Also, reference designators shown herein in parenthesis indicate components shown in a figure other than the one in discussion. For example, talking about a device (10) while discussing figure A would refer to an element, 10, shown in figure other than figure A.

OLED displays are generally classified into two different types, namely, passive matrix and active matrix. In passive matrix OLED technologies, each row of pixels is controlled sequentially. These pixels do not include storage capacitors, so they remain OFF for larger amounts of time than in active OLED displays. Additionally, higher voltages are required to drive the passive OLED pixels to a given brightness for the overall display. However, passive matrix OLED displays are inexpensive and simple to fabricate.

By contrast, in active matrix OLED displays, each pixel includes a driver circuit that includes a plurality of thin film transistors and one or more capacitors for energy storage. These pixels can be actuated via their respective driver circuits individually. Additionally, the inclusion of a storage capacitor with each pixel allows pixels to stay on for longer amounts of time. This allows active matrix OLED displays to be much larger than passive matrix OLED displays. Additionally, active matrix OLED displays offer low power consumption, small dot pitch, and slimmer form factors. For this reason, active matrix OLED displays are becoming an increasingly popular choice for use in electronic devices.

Figure 3:
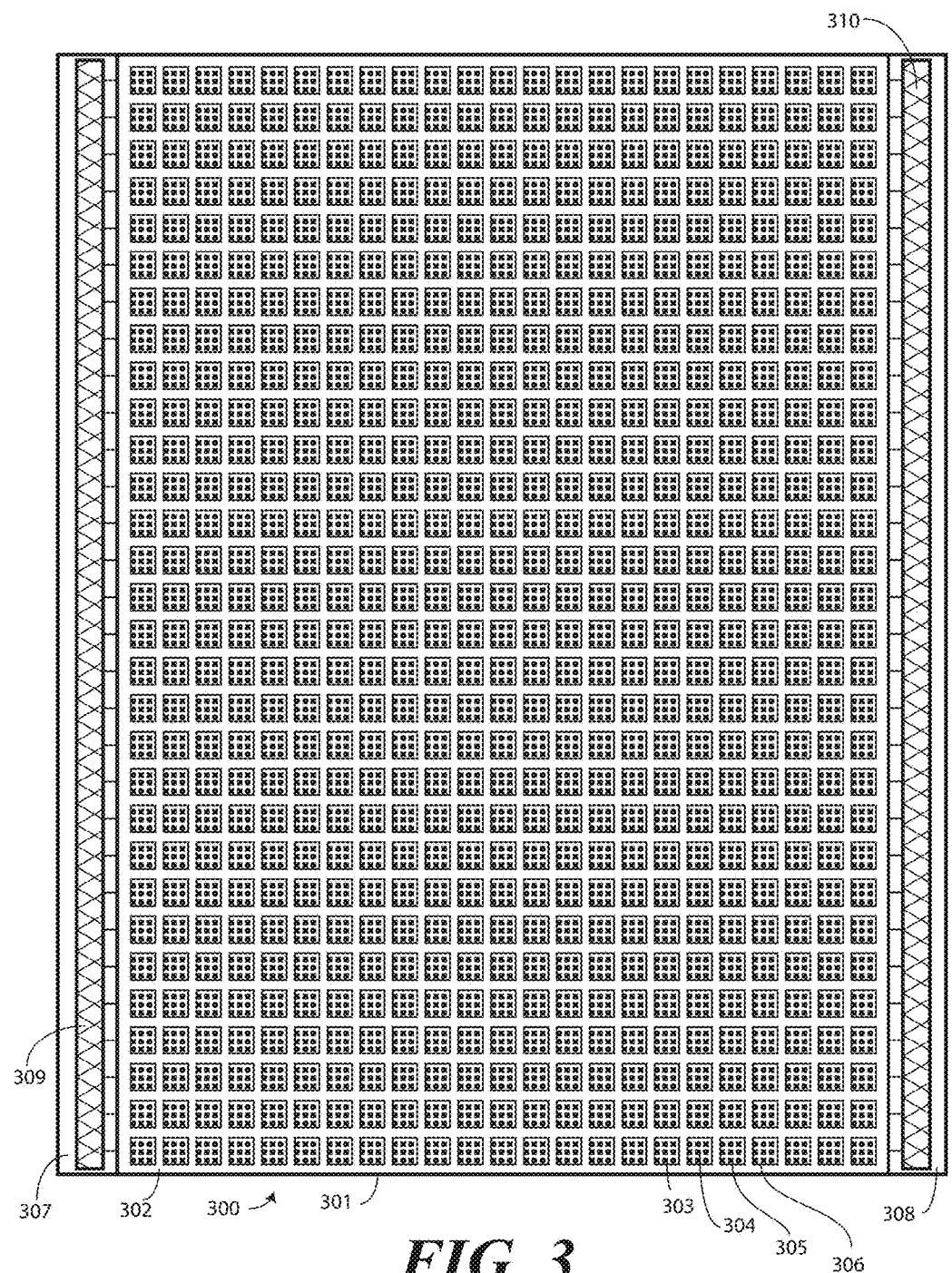
FIG. 3 illustrates a prior art OLED display.

Turning now to FIG. 3, illustrated therein is one example of a prior art active matrix OLED display 300. The active matrix OLED display 300 includes a substrate 301. A pixel area 302 is created along the substrate by forming an array of uniform pixels 303,304,305,306 along the pixel area 302.

In prior art active matrix OLED displays 300, non-pixel areas 307,308 are then required about the pixel area 302. Circuit components 309,310 such as data drivers, and optionally scan drivers or light emission signal drivers, are then disposed in these non-pixel areas 307,308. Additionally, power lines (ELVDD), cathode power lines (ELVSS), and other conductors can be placed in these non-pixel areas. The ELVDD line provides a common node for each of the uniform pixels 303,304,305,306, while the ELVSS line delivers signal voltages to each of the uniform pixels 303, 304,305,306.

Figure 4:
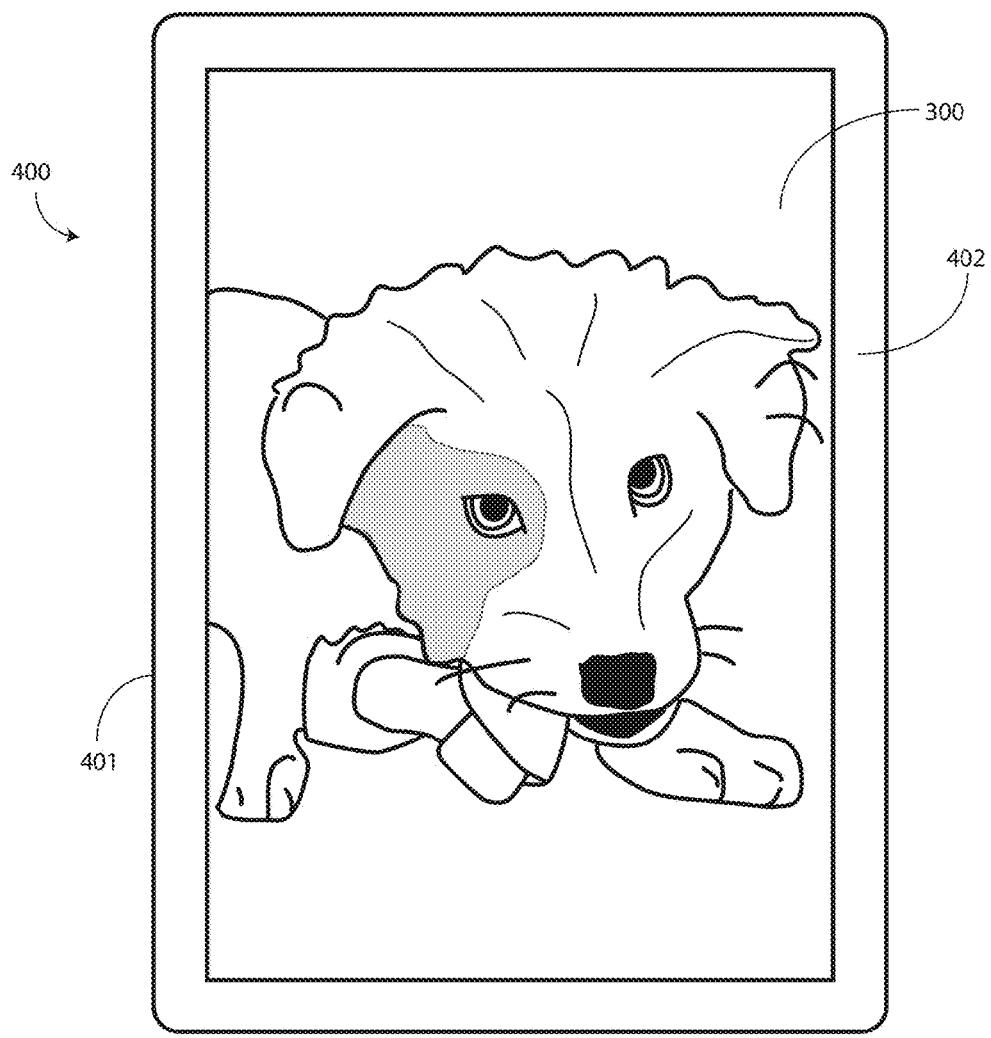
FIG. 4 illustrates a prior art electronic device with a prior art OLED display.

The problem with these non-pixel areas 307,308 is that they define "dead space" along the substrate upon which no images can be displayed. Consequently, when the prior art active matrix OLED display 300 is disposed within an electronic device 400, such as that shown in FIG. 4, the housing 401 of the electronic device 400 must include borders 402 that cover this dead space. The active matrix OLED display 300 is therefore always picture framed by the borders 402 of the housing 401, which results in the electronic device 400 being larger than it need be for a given display dimension.

Embodiments of the present disclosure advantageously solve this problem by providing an active matrix OLED display that has no dead space. Said differently, in one or more embodiments the substrate of an active matrix OLED defines only pixel portions and is devoid of non-pixel portions. This elimination of non-pixel portions allows the entire extent of the substrate to display images, which results in a "borderless" display design. Accordingly, borders of electronic device housings are not required because there are no dead spaces that need covering. In fact, in one embodiment, an active matrix OLED display configured in accordance with embodiments of the present disclosure can wrap about multiple major faces of an electronic device to present images along all surfaces of the electronic device without interruption.

In one embodiment, an organic light emitting diode display comprises a substrate. In one embodiment, the substrate defines a first pixel portion and one or more second pixel portions. Pixels formed in the first pixel portion each comprise a first driver circuit. By contrast, other pixels formed in the one or more second pixel portions each comprise a second driver circuit that is different from the first driver circuit. In one embodiment, the second driver circuit occupies less area along the substrate than does the first driver circuit. In another embodiment, the second driver circuit comprises fewer circuit components, such as thin film transistors and/or capacitors, than the first driver circuit. In another embodiment, the second driver circuit has only two or fewer transistors and a single storage capacitor, while the first driver circuit includes six or more transistors and one or two storage capacitors.

By using the second driver circuit with each pixel of the second pixel portions, real estate along the second pixel portions is freed for other uses. In one embodiment, at least one data driver circuit is collocated with the other pixels formed in at least one of the one or more second pixel portions. Optionally, scan drivers or light emission signal drivers, or other components, including ELVDD and ELVSS lines, can be collocated with the pixels of the second pixel portions as well.

Accordingly, in contrast to having uniform pixels as shown above with reference to the prior art active matrix OLED display (300) of FIG. 3, embodiments of the present disclosure provide a heterogeneous pixel structure where pixels with larger, more complex supporting circuitry are formed in the first pixel portion. Pixels with smaller, less complex supporting circuitry are then formed in the one or more second pixel portions. This allows driving circuits, including the data driver circuit, and optionally scan drivers, light emission signal drivers, and/or ELVDD and ELVSS lines, to be disposed along the second pixel portions in a collocated relationship with the pixels of the second pixel portions. This results in a borderless design without dead spots.

Turning now to FIG. 1, illustrated therein is a first pixel 100 suitable for use with embodiments of the present disclosure. As shown, the pixel 100 includes three subpixels, namely a first subpixel 101, a second subpixel 102, and a third subpixel 103. In one embodiment, the first subpixel 101 emits a first color of light, while the second subpixel 102 emits a second color of light. A third subpixel 103 emits a third color of light. The three colors combine to create a desired color for the presentation of images.

In one embodiment, the first subpixel 101 comprises a red subpixel, while the second subpixel 102 comprises a green subpixel. The third subpixel 103 then comprises a blue subpixel. In some embodiments the third subpixel 103 may be larger than the first subpixel 101 and the second subpixel 102 because blue subpixels sometimes have a shorter lifespan than do red or green subpixels.

The pixel 100 of FIG. 1 is suitable for use in an active matrix OLED display. As noted above, when used in active matrix OLED displays, pixels require additional components. These additional components include a plurality of thin film transistors and one or more capacitors for energy storage. In this illustrative embodiment, each subpixel 101, 102,103 has an identical circuit structure and includes a driver circuit 112 that includes six thin film transistors 104,105,106,107,108,109 and two energy storage capacitors 110,111. The energy storage capacitors 110,111 stores a charge sufficient to actuate the light emitting diode 113 of the subpixel 101, while the thin film transistors 104,105, 106,107,108,109 regulate when the energy storage capacitors 110,111 charge and discharge.

These six thin film transistors 104,105,106,107,108,109 and two energy storage capacitors 110,111 take up a large area 114 along the substrate. While the thin film transistors 104,105,106,107,108,109 can be manufactured from transparent materials such as indium-tin oxide (In.sub.2 O.sub.3-SnO.sub.2), they still take up space. Moreover, the energy storage capacitors 110,111 are generally manufactured from deposited metal and require a substantial portion of the area 114 of the subpixel 101 as well. In most instances the area 114 consumed by the supporting components is far larger than that of the light emitting diode 113, as shown in FIG. 1. While six thin film transistors 104,105,106,107,108,109 are shown in the illustrative embodiment of FIG. 1, other constructs employ seven thin film transistors. The benefit gained in exchange for this large area 114 is greater control of capacitor charging and discharging, thereby improving brightness and color stability from the subpixel 101.

Figure 2:
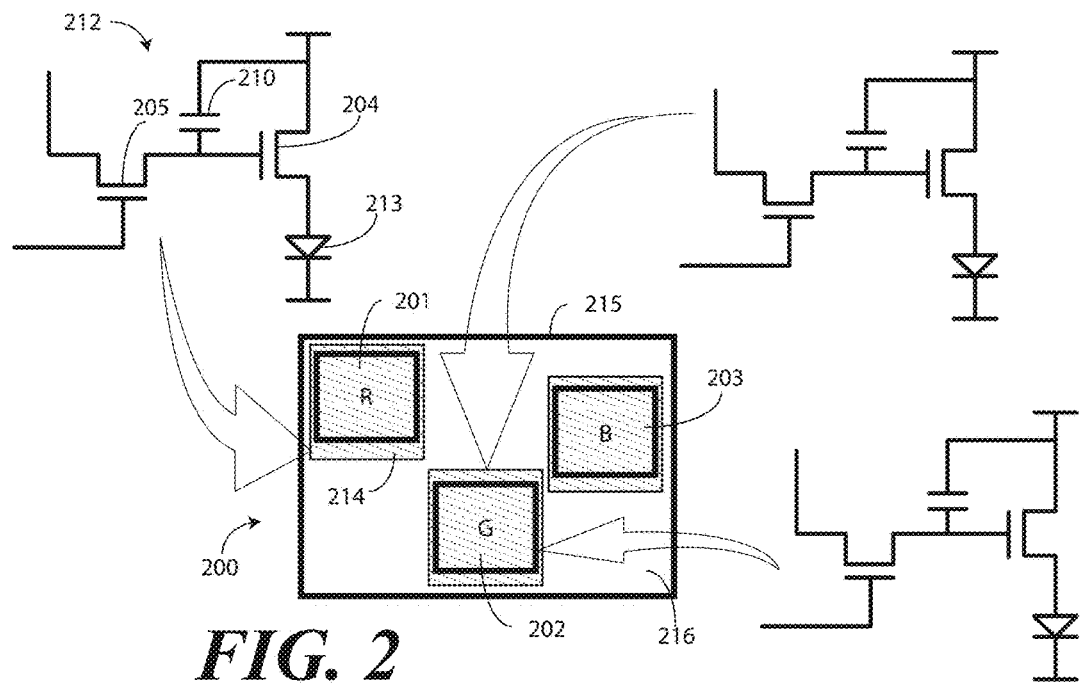
FIG. 2 illustrates a second explanatory pixel for an OLED display in accordance with one or more embodiments of the disclosure.

Turning now to FIG. 2, illustrated therein is an alternate pixel 200 suitable for use with one or more embodiments of the disclosure. As with the pixel (100) of FIG. 1, this pixel 200 includes a first subpixel 201, a second subpixel 202, and a third subpixel 203. The first subpixel 201 emits a first color of light, while the second subpixel 202 emits a second color of light, and the third subpixel 203 emits a third color of light. The three colors combine to create a desired color for the presentation of images.

As with the pixel (100) of FIG. 1, the pixel 200 of FIG. 2 is suitable for use in an active matrix OLED display.

Accordingly, each subpixel 201 requires a driver circuit 212. The driver circuit 212 includes a plurality of thin film transistors and one or more capacitors for energy storage.

In this illustrative embodiment, each subpixel 201,202, 203 has an identical circuit structure and includes a driver circuit 212 that includes only two thin film transistors 204,205 and only one energy storage capacitor 110. The energy storage capacitor 110 stores a charge sufficient to actuate the light emitting diode 213 of the subpixel 201, while the thin film transistors 204,205 regulate when the energy storage capacitor 210 charges and discharges. While two thin film transistors 204,205 are shown in the illustrative embodiment of FIG. 2, the simplest driver circuit would include a single thin film transistor and a single energy storage capacitor.

By comparing the driver circuit (112) of FIG. 1 and the driver circuit 212 of FIG. 2, several things can be seen. First, the driver circuit (112) if FIG. 1 includes six or more thin film transistors (104,105,106,107,108,109) and two energy storage capacitors (110,111), while the driver circuit 212 of FIG. 2 includes two or fewer thin film transistors 204,205 and a single energy storage capacitor 210. Thus, the driver circuit (112) of FIG. 1 comprises fewer thin film transistors than does the driver circuit 212 of FIG. 2. Similarly, the driver circuit (112) of FIG. 1 comprises fewer capacitors than does the driver circuit 212 of FIG. 2.

The net result of this reduction in supporting circuit elements is that the driver circuit 212 of FIG. 2 occupies less area 214 along the substrate 215 than does the driver circuit (112) of FIG. 1. While this can result in more brightness variation or dimmer color from the subpixels 201,202,203, the reduction in area 214 along the substrate 215 advantageously allows other components to be collocated with the pixel 200 of FIG. 2. For example, a driver circuit can be formed along the substrate 215 in portions 216 of the pixel 200 that are not occupied by the thin film transistors 204 and energy storage capacitor 210. This allows the circuit components (309,310) normally relegated to dead space, i.e., non-pixel portions, such as data drivers, and optionally scan drivers or light emission signal drivers, to be moved into pixel portions where the pixels formed therein are the pixels 200 of FIG. 2 and not the pixels (100) of FIG. 1. Additionally, ELVDD and ELVSS lines can be collocated with the pixels 200 of FIG. 2, thereby allowing pixels to be placed along the entirety of the substrate 215 with no dead space. This results in a display having a "borderless design" in that the substrate 215 is devoid of non-pixel portions.

Figure 5:
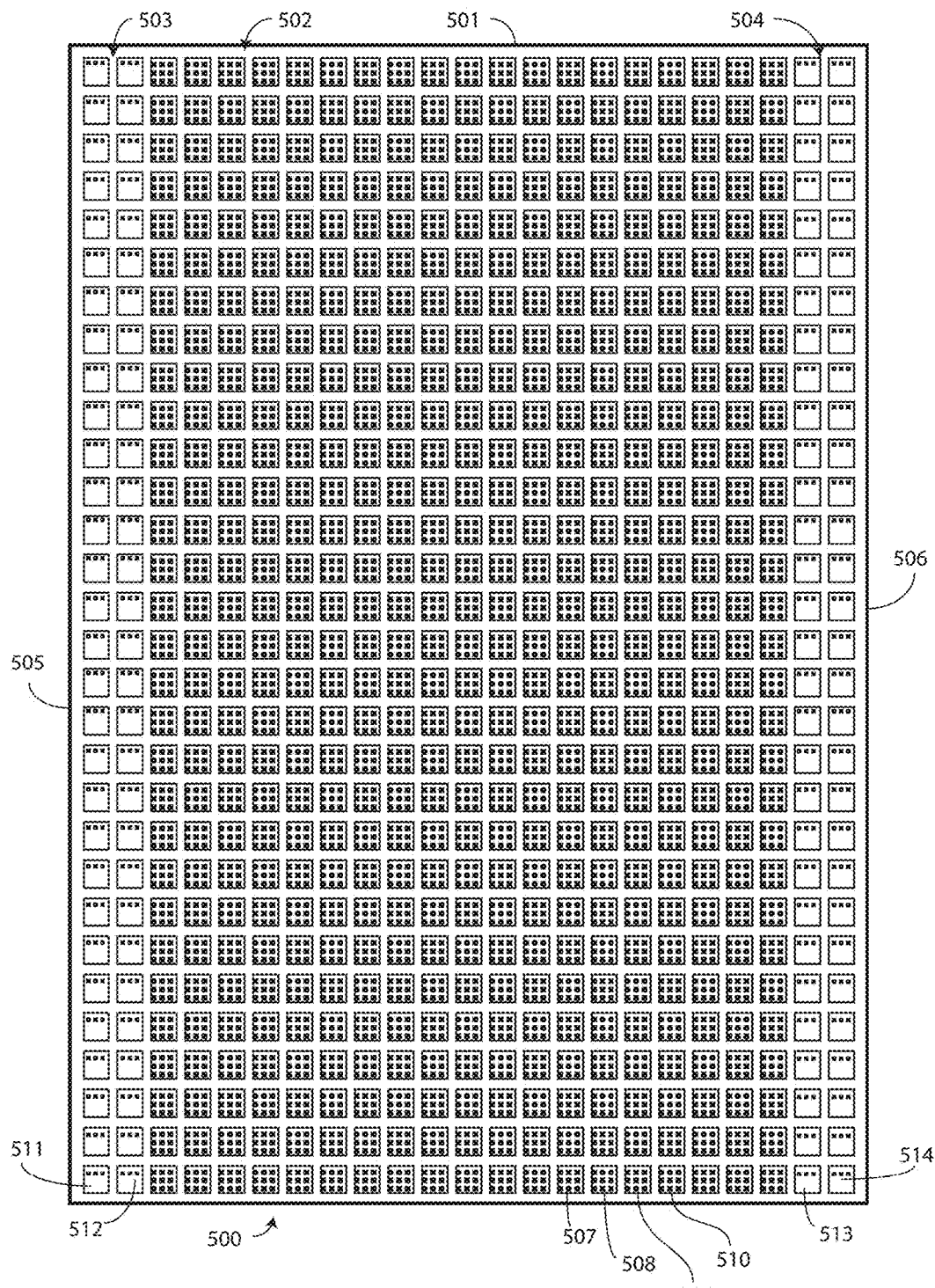
FIG. 5 illustrates a substrate defining a first pixel portion and one or more second pixel portions in accordance with one or more embodiments of the disclosure, with pixels formed in each of the pixel portions.

Turning now to FIG. 5, illustrated therein is one explanatory display 500 configured in accordance with one or more embodiments of the disclosure. The display 500 of FIG. 5 is an active matrix OLED display and includes a substrate 501.

The substrate 501 defines a first pixel portion 502 and one or more second pixel portions. In this illustrative embodiment, the one or more second pixel portions comprising two second pixel portions 503,504. The substrate 501 in this illustrative embodiment defines a first edge 505 and a second edge 506, and one second pixel portion 503 is disposed along the first edge 505 while another second pixel portion 504 is disposed along the second edge 506. The first pixel portion 502 is disposed between the two second pixel portions 503,504. As shown in FIG. 5, the display 500 is devoid of the non-pixel areas (307,308) shown in FIG. 3.

In this illustrative embodiment, pixels 507,508,509,510 formed in the first pixel portion 502 are the pixels (100) of FIG. 1. Accordingly, each pixel 507,508,509,510 comprises a first driver circuit (112). By contrast, other pixels 511,512, 513,514 formed in the one or more second pixel portions 503,504 are the pixels (200) of FIG. 2. Each thus comprises a second driver circuit (112). As described above, in one embodiment the second driver circuit (112) occupies less area along the substrate 501 than the first driver circuit (112). This is true because the second driver circuit (112) comprises fewer thin film transistors (204,205) than the first driver circuit (112). In one or more embodiments, the second driver circuit (212) additionally comprises fewer energy storage capacitors (210) than the first driver circuit (112).

Figure 6:
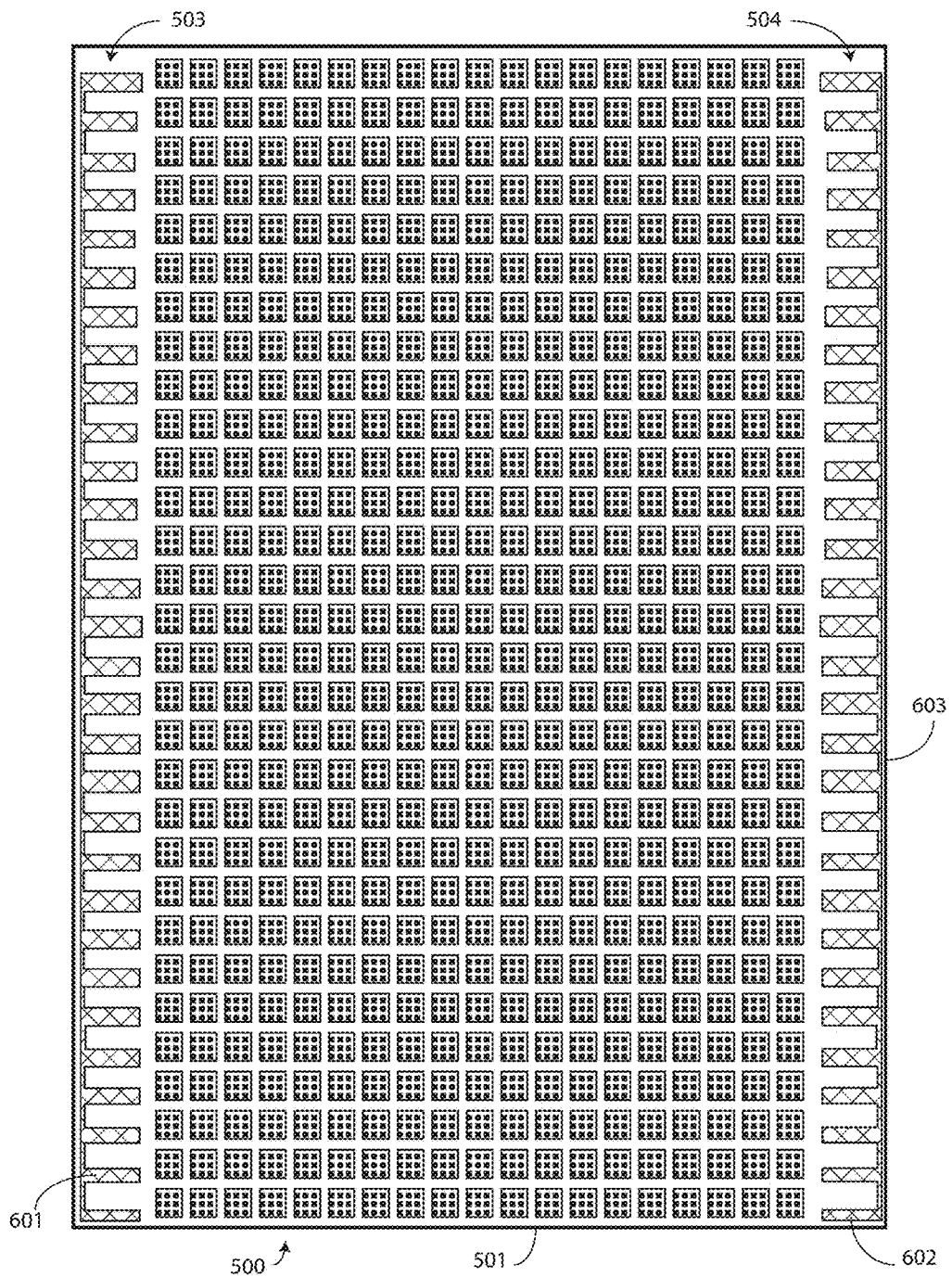
FIG. 6 illustrates the substrate of FIG. 5 with the pixels of the one or more second pixel portions removed so that a driver circuit that is collocated with the pixels can be seen.

Turning now to FIG. 6, the display 500 is shown again. In this illustration, the other pixels (511,512,513,514) formed in the one or more second pixel portions 503,504 have been removed so that other components of the display 500 can be seen. In one or more embodiments, since the second driver circuit (112) occupies less area along the substrate 501 than the first driver circuit (112), other components can be disposed within the extra space. In this illustrative embodiment, at least one data driver circuit 601 is shown collocated with the other pixels (511,512,513,514) formed in the one or more second pixel portions 503,504. In this embodiment the data driver circuit 601 is configured as a shift register that delivers data to the various pixels to cause the display 500 to present images to a user. The data driver circuit 601 delivers data signals to the pixels through data lines (not shown) to cause the presentation of images.

Other components 602 can be shown collocated with the other pixels (511,512,513,514) formed in the one or more second pixel portions 503,504 as well. Illustrating by example, the other components 602 can include a scan driver, a light emission control driver, ELVDD lines, or ELVSS lines. As is readily known in the art, these other components 602 can be used to select pixels, generate voltages corresponding to image signals, and otherwise control the pixels to present light to create images along the display 500.

In one embodiment, the data driver circuit 601 and/or the other components 602 are collocated with the other pixels (511,512,513,514) formed in the one or more second pixel portions 503,504 due to the fact that they have smaller driver circuits (112), and thereby enough room to accommodate the data driver circuit 601 and/or the other components 602 beneath image presenting portions of the display, i.e., beneath pixel portions 502,503, rather than along non-pixel portion dead spaces. Advantageously, this construct removes the "borders" defined by the dead spaces defined by the non-pixel areas (307,308) of FIG. 3. The pixel portions 502,503 consume entire extent of the substrate spanning an interior of the perimeter 603 of the substrate 501, leaving only manufacturing margins required for cutting the substrate 501 extending beyond the pixels. This results in the display 500 and substrate being devoid of non-pixel portions. This creates a larger active display area for a give substrate when compared to prior art displays.

Figure 7:
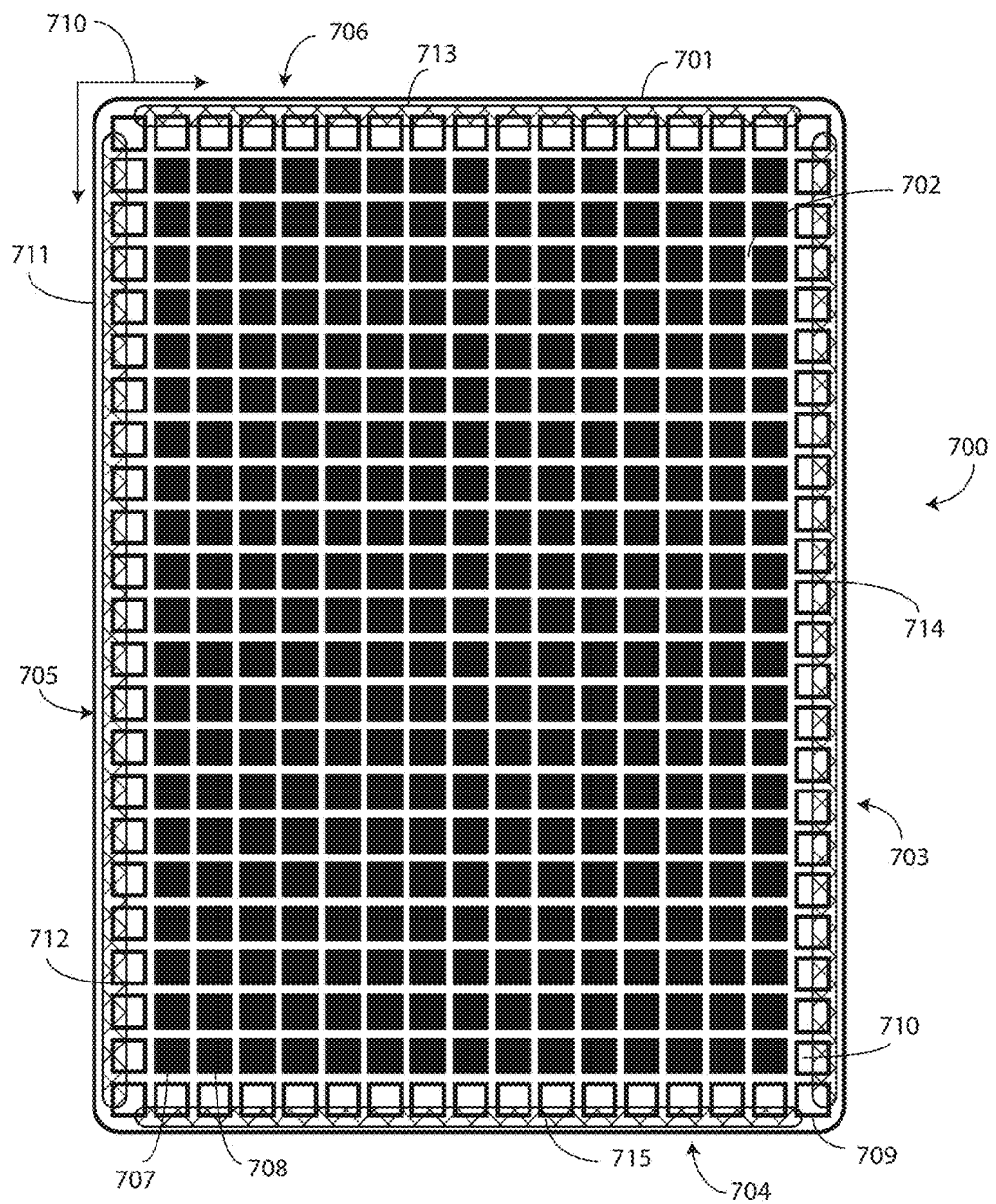
FIG. 7 illustrates one explanatory OLED display in accordance with one or more embodiments of the disclosure.

Turning now to FIG. 7, illustrated therein is another display 700 configured in accordance with one or more embodiments of the disclosure. The display 700 of FIG. 7 is an active matrix OLED display. In the illustrative embodiment of FIG. 7, the display 700 includes a substrate 701 defining an extent 710 that spans an interior of a perimeter 711 defined by the outer edges of the substrate 701.

Along this extent 710, the substrate also defines a plurality of pixel portions. In this illustrative embodiment, the plurality of pixel portions comprise a first pixel portion 702 that is surrounded by four second pixel portions 703,704,705, 706. Here each of the second pixel portions 703,704,705,706 is disposed adjacent to sections of the perimeter 711, respectively, with the first pixel portion disposed interior along the extent 710 relative to the four second pixel portions 703, 704,704,706.

In one embodiment, pixels 707,708 formed in the first pixel portion 702 are the pixels (100) of FIG. 1. Accordingly, each pixel 707,708 comprises the first driver circuit (112). By contrast, other pixels 708,708 formed in the one or more second pixel portions 703,704,705,706 are the pixels (200) of FIG. 2. Each thus comprises a second driver circuit (212), which less area along the substrate 701 than the first driver circuit (112) due to the fact that it comprises fewer circuit components, i.e., thin film transistors (204,205) and/or energy storage capacitors (210), than the first driver circuit (112).

Other circuit components are then collocated with the other pixels 708,708 formed in the one or more second pixel portions 703,704,705,706. In one embodiment, a data driver circuit 712, a scan driver 713, a light emission signal driver, and ELDSS and ELVDD lines 715 are all collocated with the other pixels 708,709 formed in the one or more second pixel portions 703,704,705,706. This creates a borderless display.

Figure 8:
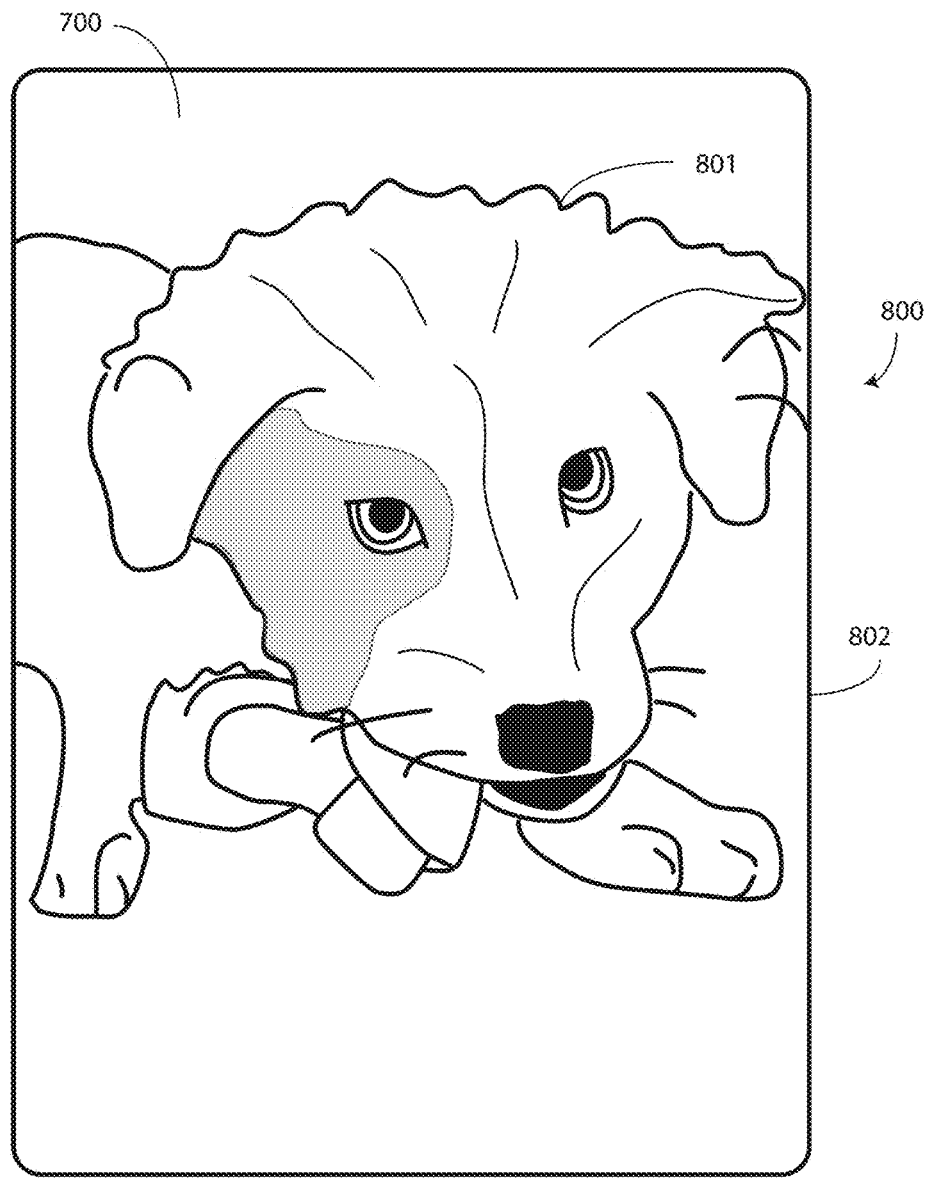
FIG. 8 illustrates one explanatory electronic device in accordance with one or more embodiments of the disclosure.

Turning now to FIG. 8, illustrated therein is an electronic device 800 comprising the display 700 of FIG. 7. As shown in FIG. 8, the entire extent (710) of the display is available for presenting images 801 to a user. There is no need for the housing 802 of the electronic device 800 to include borders that picture frame the display 700. To the contrary, the display 700 can span an entire major face of the electronic device 800 so that the entirety of the major face can be used as active display area.

Moreover, as the display 700 of FIG. 8 includes rounded, free-formed corners, the borderless design provides additional benefits. For prior art active matrix OLED displays to be configured in non-rectangular shape, the dead space required becomes even greater than that shown above with reference to FIG. 3. Accordingly, the borderless design of FIG. 8 allows an even greater portion of dead space to be recovered and actively used for displaying images 801.

Figure 9:
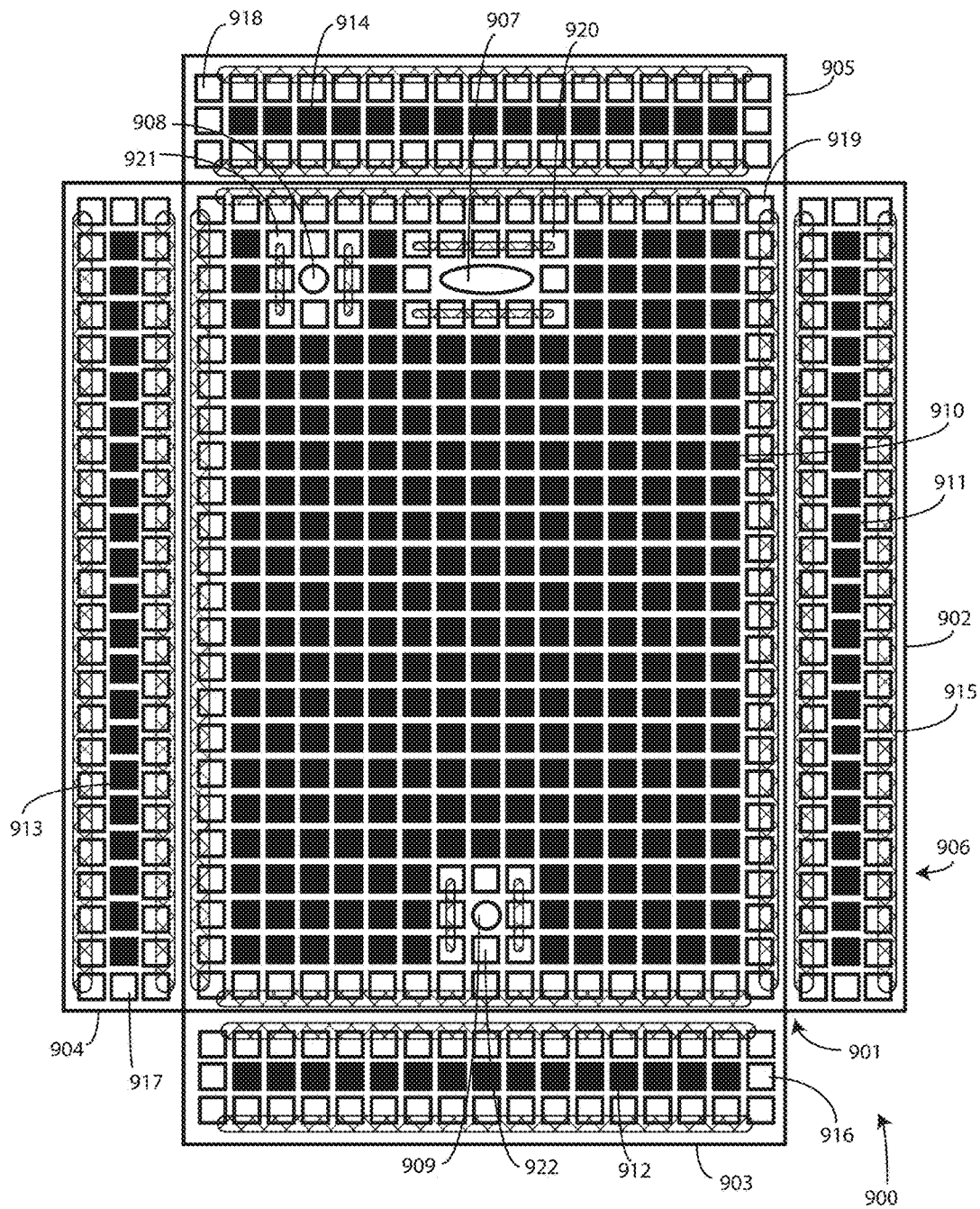
FIG. 9 illustrates another explanatory OLED display in accordance with one or more embodiments of the disclosure.

Turning now to FIG. 9, illustrated therein is another display 900 configured in accordance with one or more embodiments of the disclosure. The display 900 of FIG. 9 is an active matrix OLED display. The display 900 includes a central portion 901 and four flaps 902,903,904,905 that extend distally from sides of the central portion 901. In this embodiment, the display 900 is fabricated on a flexible plastic substrate 906. Accordingly, each flap 902,903,904, 905 can bend and fold relative to the central portion 901 along an intersecting fold line. While the central portion 901 and flaps 902,903,904,905 are rectangular for ease of illustration, they could take other shapes as well, and could have rounded or free-form corners and/or sides. Other shapes of the central portion 901 and flaps 902,903,904,905 will be obvious to those of ordinary skill in the art having the benefit of this disclosure.

In one or more embodiments, the flexible plastic substrate 906 allows the display 900 to become flexible in one or more embodiments with various bending radii. For example, some embodiments allow bending radii of between thirty and six hundred millimeters to provide a bendable display. Other substrates allow bending radii of around five millimeters to provide a display that is foldable through active bending. Other displays can be configured to accommodate any of bends, rolls and folds, alone or in combination. In one or more embodiments the display 900 may be formed from multiple layers of flexible material such as flexible sheets of polymer or other materials.

In the illustrative embodiment of FIG. 9, the display 900 defines one or more apertures 907,908,909. Illustrating by example, one aperture 907 could be used to accommodate a loudspeaker that is disposed beneath the display 900 in an electronic device. The loudspeaker can deliver acoustic signals through the aperture 907. Similarly, aperture 908 could be included to allow an image capture device to be positioned beneath the display 900, and to capture images through the aperture 908. Another aperture 909 could be used to accommodate a microphone, which can be positioned beneath the display 900 to receive acoustic signals through the aperture 909. While these three apertures are examples of potential apertures that can be included, embodiments of the disclosure are not so limited. Fewer apertures, more apertures, or other apertures could be included as well. Still others will be obvious to those of ordinary skill in the art having the benefit of this disclosure.

Disposed along the central portion 901 and flaps 902,903, 904,905 are a plurality of pixel portions. For example flap 902 includes a first pixel portion 911 and a second pixel portion 915. Flap 903 includes another first pixel portion 912 and a second pixel portion 916, while flap 904 includes yet another first pixel portion 913 and second pixel portion 917. Similarly, flap 905 includes another first pixel portion 914 and a second pixel portion 918. Each second pixel portion is disposed between perimeter edges of each flap, with the corresponding second pixel portion surrounding the corresponding first pixel portion. For example, second pixel portion 915 is disposed between the perimeter edges of flap 902 of the flexible plastic substrate 906, with first pixel portion 911 disposed interior to second pixel portion 915. Similarly, second pixel portion 916 is disposed between the perimeter edges of flap 903 of the flexible plastic substrate 906, with first pixel portion 912 disposed interior to second pixel portion 916, and so forth.

Central portion 901 includes multiple pixel portions. These include a first pixel portion 910 and four second pixel portions: second pixel portion 919, second pixel portion 920, second pixel portion 921, and second pixel portion 922. Second pixel portion 919 is disposed between the perimeter edges of the central portion 901 of the flexible plastic substrate 906, with first pixel portion 910 disposed interior to second pixel portion 919.

Each of second pixel portion 920, second pixel portion 921, and second pixel portion 922 then surrounds a corresponding aperture. For example, second pixel portion 920 surrounds aperture 907, while second pixel portion 921 surrounds aperture 908 and second pixel portion 922 surrounds aperture 909.

In one embodiment, pixels formed in the first pixel portions 910,911,912,913,914 are the pixels (100) of FIG. 1, or alternatively are pixels comprising six or more thin film transistors and at least one energy storage capacitor. Accordingly, each pixel comprises the first driver circuit (112) or equivalent. By contrast, other pixels formed in the one or more second pixel portions 915,916,917,918,919,920,921, 922 are the pixels (200) of FIG. 2, or alternatively are pixels comprising two or fewer thin film transistors and only one energy storage transistor. Each thus comprises a second driver circuit (212), or equivalent, which occupies less area along the flexible plastic substrate 906 than the first driver circuit (112) due to the fact that it comprises fewer circuit components.

Accordingly, as noted above, other circuit components can then be collocated with the other pixels formed in the one or more second pixel portions 915,916,917,918,919, 920,921,922 to create a borderless display, both along the edges of the flexible plastic substrate 906 and about the apertures 907,908,909. Additionally, the display is borderless at the fold lines defined between the central portion 901 and each respective flap 902,903,904,905. In one embodiment, these other circuit components can comprise one or more of a data driver circuit, a scan driver, a light emission signal driver, and/or ELDSS and/or ELVDD lines. These components can be all collocated with the other pixels formed in the one or more second pixel portions 915,916, 917,918,919,920,921,922 to create a borderless display.

Figure 10:
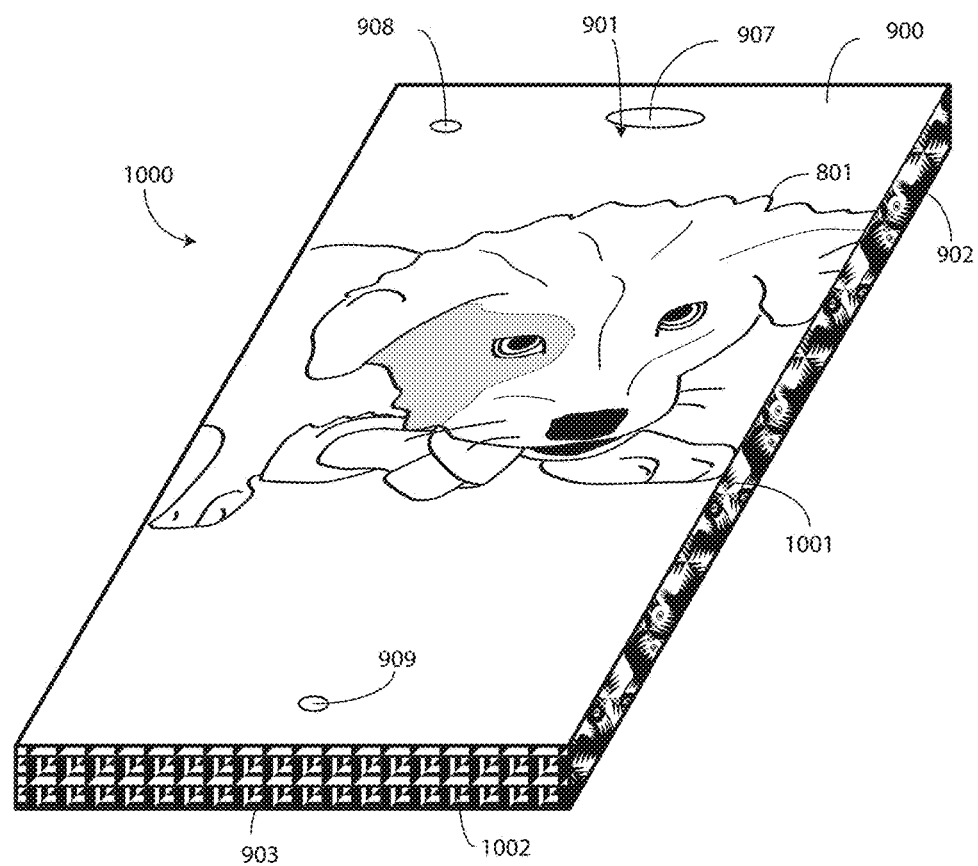
FIG. 10 illustrates another explanatory electronic device in accordance with one or more embodiments of the disclosure.

Turning now to FIG. 10, illustrated therein is an electronic device 1000 comprising the display 900 of FIG. 9. As shown, the flaps 902,903,(904,905) have been folded about the minor faces of the electronic device 1000. The central portion 901 of the display 900 defines a major face of the electronic device. A microphone is disposed under aperture 909, while an image capture device is disposed under aperture 908. A loudspeaker can be disposed beneath aperture 907. Advantageously, the fact that the display 900 spans a plurality of major faces of the electronic device 1000 allows the borderless design to facilitate the presentation of images 801,1001,1002 along both major and minor faces of the electronic device 1000.

Figure 11:
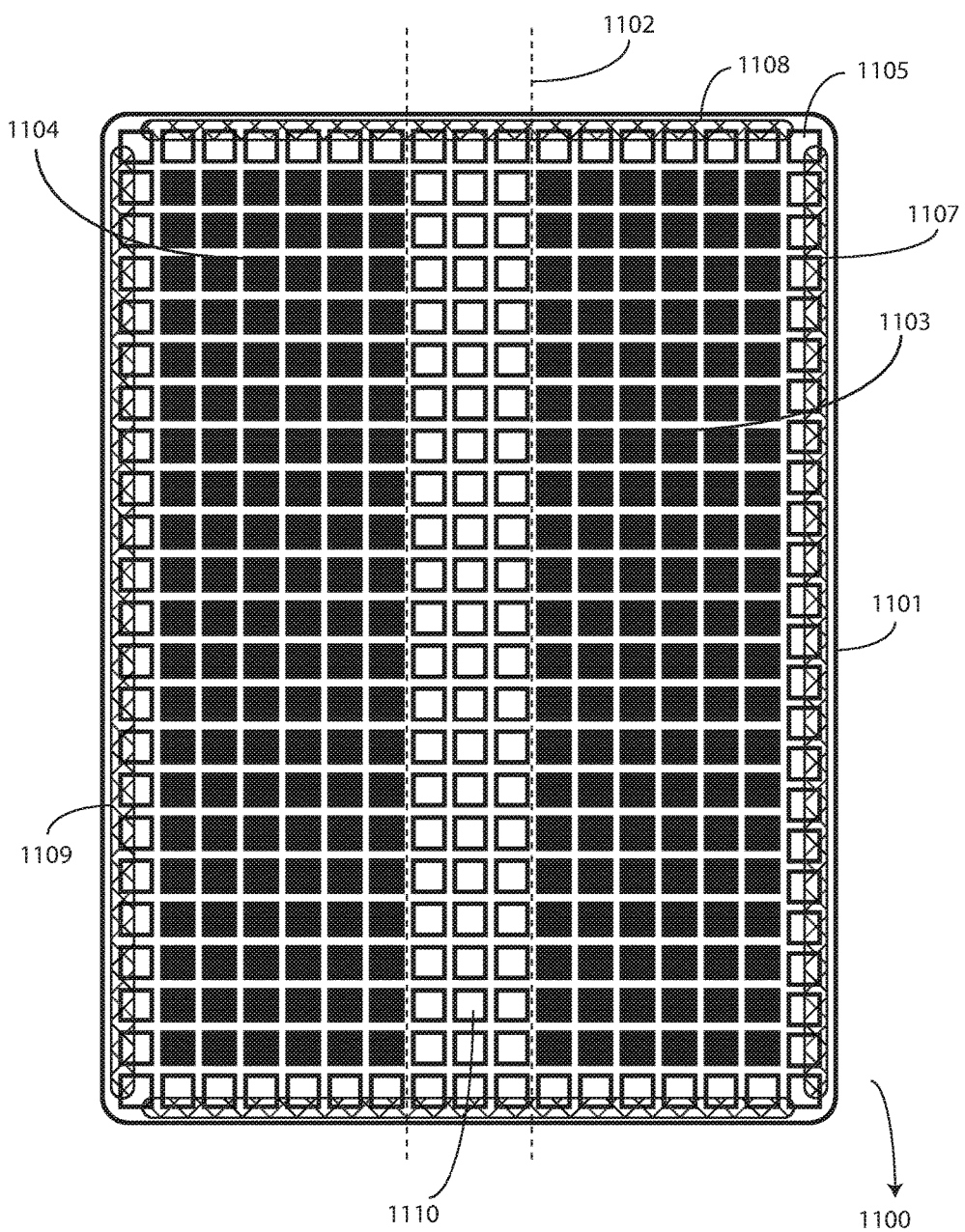
FIG. 11 illustrates yet another explanatory OLED display in accordance with one or more embodiments of the disclosure.

Turning now to FIG. 11, illustrated therein is another display 1100 configured in accordance with one or more embodiments of the disclosure. As with the display (900) of FIG. 9, the display 1100 of FIG. 11 is configured on a flexible plastic substrate 1101. The display 1100 is for use in a "bendable" electronic device that has a deformable housing. In one embodiment, the display 1100 is configured to bend along a deformation portion 1102.

Disposed along the flexible plastic substrate 1101 is a plurality of pixel portions. For example, a first pixel portion 1103 is disposed to a first side of the deformation portion 1102, while another first pixel portion 1104 is disposed to the other side of the deformation portion 1102.

A first second pixel portion 1105 circumscribes both first pixel portions 1103,1104. In one embodiment, pixels formed in the first pixel portions 1103,1104 are the pixels (100) of FIG. 1, or alternatively are pixels comprising six or more thin film transistors and at least one energy storage capacitor. Accordingly, each pixel comprises the first driver circuit (112) or equivalent. By contrast, other pixels formed in the one or more second pixel portion 1105 are the pixels (200) of FIG. 2, or alternatively are pixels comprising two or fewer thin film transistors and only one energy storage transistor. Each thus comprises a second driver circuit (212), or equivalent, which occupies less area along the flexible plastic substrate 1101 than the first driver circuit (112) due to the fact that it comprises fewer circuit components.

As demonstrated above, other circuit components 1107, 1108,1109 can then be collocated with the other pixels formed in the one or more second pixel portion 1105 to create a borderless display along the edges of the flexible plastic substrate 1101. In one embodiment, these other circuit components can comprise one or more of a data driver circuit, a scan driver, a light emission signal driver, and/or ELDSS and/or ELVDD lines. These components can be all collocated with the other pixels formed in the one or more second pixel portion 1105 to create a borderless display.

In this illustrative embodiment, there is another second pixel portion 1110 formed in the deformation portion 1102. Embodiments of the disclosure contemplate that pixels having fewer thin film transistors and/or energy storage capacitors located in the deformation portion 1102 create less mechanical stress on the flexible plastic substrate 1101 than do those having more thin film transistors and/or energy storage capacitors. Accordingly, by disposing these pixels in the deformation portion 1102, the flexible plastic substrate 1101 is able to undergo more bending operations without compromising performance reliability than would a prior art, uniform pixel display.

Figure 12:
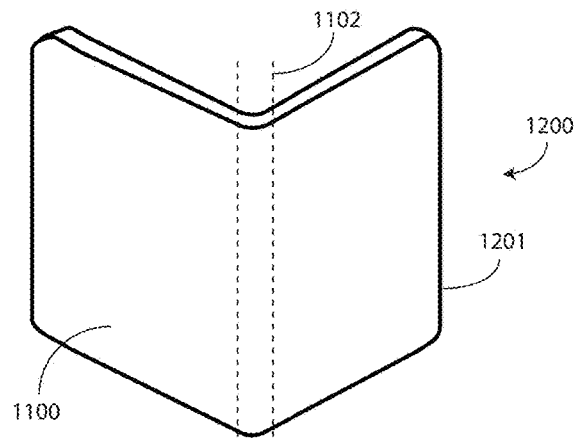
FIG. 12 illustrates yet another explanatory electronic device in accordance with one or more embodiments of the disclosure.

Turning now to FIG. 12, illustrated therein is one explanatory electronic device 1200 configured in accordance with one or more embodiments of the disclosure. The electronic device 1200 of FIG. 12 is a portable electronic device, and is shown operating as a tablet computer. This illustrative electronic device 1200 includes the display 1100 of FIG. 11, which may optionally be touch-sensitive. In one embodiment where the display 1100 is touch-sensitive, the display 1100 can serve as a primary user interface of the electronic device 1200. Users can deliver user input to the display 1100 of such an embodiment by delivering touch input from a finger, stylus, or other objects disposed proximately with the display.

In one embodiment, when operating as a tablet computer, the display 1100 has a diagonal dimension of between about seven and ten inches, inclusive. In one illustrative embodiment, the display has a diagonal dimension of about nine inches. Such a diagonal dimension is advantageous in that it allows the electronic device 1200 to operate as a tablet computer when undeformed, and as a smartphone that fits comfortably in a user's hand when deformed by a central bend at a deformation portion. However, other diagonal dimensions will be obvious to those of ordinary skill in the art having the benefit of this disclosure.

The explanatory electronic device 1200 of FIG. 12 also includes a housing 1201 supporting the display 1100. In one or more embodiments, the housing 1201 is flexible. In one embodiment, the housing 1201 may be manufactured from a malleable, bendable, or physically deformable material such as a flexible thermoplastic, flexible composite material, flexible fiber material, flexible metal, organic or inorganic textile or polymer material, or other materials. In other embodiments, the housing 1201 could also be a combination of rigid segments connected by hinges or flexible materials. Still other constructs will be obvious to those of ordinary skill in the art having the benefit of this disclosure.

Where the housing 1201 is a deformable housing, it can be manufactured from a single flexible housing member or from multiple flexible housing members. In this illustrative embodiment, the housing 1201 is designed to be symmetrical along a centerline bisecting the device. Thus, in one illustrative embodiment the electronic device 1200 is configured to be identical in appearance and function along each side of the device when folded along a reference line, such as a centerline. Other configurations will be obvious to those of ordinary skill in the art having the benefit of this disclosure.

The electronic device 1200 can include one or more processors. The one or more processors can be configured to process and execute executable software code to perform the various functions of the electronic device 1200. A storage device, such as memory, can optionally store the executable software code used by the one or more processors. The electronic device 1200 can also include a communication circuit that can be configured for wired or wireless communication with one or more other devices or networks. The communication circuit may also utilize wireless technology for communication, such as, but are not limited to, peer-to-peer or ad hoc communications.

Figure 13:
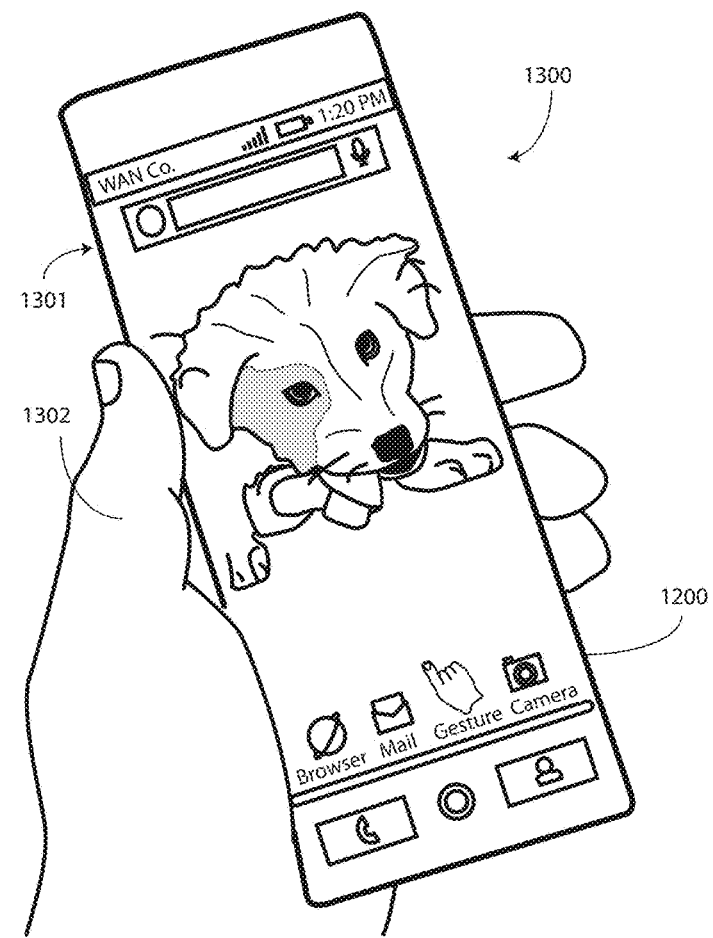
FIG. 13 illustrates the explanatory electronic device of FIG. 12 in operation.

In one embodiment, the electronic device 1200 includes one or more flex sensors, supported by the housing 1201, and operable with the one or more processors to detect a bending operation deforming one or more of the housing 1201 or the display 1100 into a deformed geometry, such as that shown in FIG. 13. The inclusion of flex sensors is optional, and in some embodiment flex sensors will not be included. The flex sensors can each comprise passive resistive devices manufactured from a material with an impedance that changes when the material is bent, deformed, or flexed. By detecting changes in the impedance as a function of resistance, the one or more processors can use the one or more flex sensors to detect bending or flexing.

In one embodiment, each flex sensor is manufactured from a series of layers combined together in a stacked structure. In one embodiment, at least one layer is conductive, and is manufactured from a metal foil such as copper. A resistive material provides another layer. These layers can be adhesively coupled together in one or more embodiments. The resistive material can be manufactured from a variety of partially conductive materials, including paper-based materials, plastic-based materials, metallic materials, and textile-based materials. In one embodiment, a thermoplastic such as polyethylene can be impregnated with carbon or metal so as to be partially conductive, while at the same time being flexible.

In one embodiment, the resistive layer is sandwiched between two conductive layers.

Electrical current flows into one conductive layer, through the resistive layer, and out of the other conductive layer. As the flex sensor bends, the impedance of the resistive layer changes, thereby altering the flow of current for a given voltage. The one or more processors can detect this change to determine an amount of bending. Taps can be added along each flex sensor to determine other information, including the number of folds, the degree of each fold, the location of the folds, the direction of the folds, and so forth.

As shown in FIG. 12, the electronic device 1200 is undergoing a bending operation to impart deformation at a deformation portion 1102 of the electronic device 1200. In one embodiment, the deformation portion 1102 is disposed about the centerline. The housing 1201 and internal components disposed along flexible substrates are allowed to bend as well along the deformation portion 1102.

One result 1300 of the bending operation is shown in FIG. 13. In this illustrative embodiment, the electronic device 1200 is deformed by a single bend 1301 at the deformation portion (1102). However, in other embodiments, the one or more bends can comprise a plurality of bends. Other deformed configurations will be obvious to those of ordinary skill in the art having the benefit of this disclosure. The electronic device 1200 is fully folded as shown in FIG. 13.

Embodiments of the disclosure contemplate that a user 1302 may hold the electronic device 1200 in one hand when in this deformed physical configuration. For example, the user 1302 may use the electronic device 1200 as a smartphone in the folded configuration of FIG. 13, while using the electronic device 1200 as a tablet computer in the unfolded. As noted above, in one or more embodiments, second pixel portions formed in the deformation portion (1102) create less mechanical stress on the flexible plastic substrate (1101) than do those having more thin film transistors and/or energy storage capacitors. Accordingly, by disposing these pixels in the deformation portion (1102), the flexible plastic substrate (1101) is able to undergo more bending operations without compromising performance reliability than would a prior art, uniform pixel display.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. An organic light emitting diode display comprising a substrate defining a first pixel portion and one or more second pixel portions, wherein pixels formed in the first pixel portion each comprise a first driver circuit and other pixels formed in the one or more second pixel portions each comprise a second driver circuit occupying less area along the substrate than the first driver circuit, further comprising at least one data driver circuit collocated with the other pixels formed in at least one of the one or more second pixel portions.

2. The organic light emitting diode display of claim 1, the second driver circuit comprising fewer transistors than the first driver circuit.

3. The organic light emitting diode display of claim 1, the second driver circuit comprising fewer capacitors than the first driver circuit.

4. The organic light emitting diode display of claim 1, the one or more second pixel portions comprising two second pixel portions, the first pixel portion disposed between the two second pixel portions.

5. The organic light emitting diode display of claim 1, the substrate devoid of non-pixel portions.

6. The organic light emitting diode display of claim 1, the substrate defining an extent spanning an interior of a perimeter of the substrate, the first pixel portion and the one or more second pixel portions disposed along an entirety of the extent.

7. The organic light emitting diode display of claim 1, the substrate defining at least one aperture, wherein at least one of the one or more second pixel portion surrounds the aperture.

8. The organic light emitting diode display of claim 1, the substrate comprising a flexible substrate, at least one of the one or more second pixel portions disposed in a deformation portion of the flexible substrate.

9. The organic light emitting diode display of claim 1, the one or more second pixel portions disposed between perimeter edges of the substrate and the first pixel portion.

10. An organic light emitting diode display, comprising:
a substrate defining an extent spanning an interior of a perimeter of the substrate and defining a plurality of pixel portions comprising a first pixel portion and one or more second pixel portions, wherein pixels formed in the first pixel portion each comprise a first driver circuit and other pixels formed in the one or more second pixel portions each comprise a second driver circuit comprising fewer circuit components than the first driver circuit; and at least one data driver circuit collocated with the other pixels formed in at least one of the one or more second pixel portions.

11. The organic light emitting diode display of claim 10, wherein the first pixel portion is disposed interior along the extent relative to the one or more second pixel portions.

12. The organic light emitting diode display of claim 10, wherein the first driver circuit comprises six or more transistors and the second driver circuit comprises two or fewer transistors.

13. The organic light emitting diode of claim 10, wherein the substrate defines a first edge and a second edge, wherein one second pixel portion is disposed along the first edge and another second pixel portion is disposed along the second edge.

14. The organic light emitting diode of claim 13, the substrate defining an aperture, further comprising a third second pixel portion disposed about the aperture.

15. The organic light emitting diode of claim 13, the substrate comprising a flexible substrate, further comprising a third pixel portion disposed along a deformation portion of the flexible display.

16. An electronic device comprising an organic light emitting diode display, the organic light emitting diode display comprising:

a substrate defining a first pixel portion and one or more second pixel portions, wherein pixels formed in the first pixel portion each comprise a first driver circuit and other pixels formed in the one or more second pixel portions each comprise a second driver circuit having fewer circuit components than first driver circuit; and at least one data driver circuit collocated with the other pixels formed in at least one of the one or more second pixel portions.

17. The electronic device of claim 16, the first driver circuit comprising six or more transistors.

18. The electronic device of claim 17, the second driver circuit comprising two or fewer transistors.

19. The electronic device of claim 16, the organic light emitting diode display spanning a plurality of major faces of the electronic device.

20. The electronic device of claim 16, the electronic device comprising a deformable housing, the substrate comprising a flexible substrate, at least one of the one or more second pixel portions disposed along a bendable portion of the electronic device.

\* \* \* \* \*